(12) United States Patent
Fujii

(10) Patent No.: US 6,355,970 B1
(45) Date of Patent: Mar. 12, 2002

(54) SEMICONDUCTOR DEVICE HAVING A HIGH FREQUENCY ELECTRONIC CIRCUIT

(75) Inventor: Hiroaki Fujii, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/572,628

(22) Filed: May 17, 2000

(30) Foreign Application Priority Data

May 19, 1999 (JP) .......................................... 11-137937

(51) Int. Cl.[7] ............................................... H01L 29/00
(52) U.S. Cl. ...................... 257/531; 257/532; 257/535
(58) Field of Search ................................ 257/531, 532, 257/535

(56) References Cited

U.S. PATENT DOCUMENTS 5,565,713 A * 10/1996 Roseen ........................ 307/105
6,104,259 A * 8/2000 Miyaura ...................... 333/176
6,218,729 B1 * 4/2001 Zavrel, Jr. et al. ........... 257/698

FOREIGN PATENT DOCUMENTS

| JP | 7-120788 | 5/1995 |
| JP | 8-102525 | 4/1996 |
| JP | 10-326868 | 12/1998 |

OTHER PUBLICATIONS

Camilleri, et al. "Bonding Pad Models for Silicon VLSI Technologies and Their Effects on the Noise Figure of RF NPNs", IEEE MTT–S Digest, 1994, p. 1179–1183.

* cited by examiner

Primary Examiner—Ngân V. Ngô
(74) Attorney, Agent, or Firm—McGinn & Gibb, PLLC

(57) ABSTRACT

There is provided a semiconductor device including (a) a semiconductor substrate on which an integrated circuit is formed, (b) a ground electrode formed on the semiconductor substrate, (c) a bonding wire through which the ground electrode is grounded, the bonding wire having inductance, and (d) a capacitor positioned in series with the inductance, the capacitor and the inductance cooperating with each other to form a resonance circuit at an operating frequency of the integrated circuit. For instance, the capacitor is comprised of a lower electrode formed on or above the semiconductor substrate, an insulating film covering the lower electrode therewith, and an upper electrode formed on the insulating film above the lower electrode. The provided semiconductor device reduces noises and saves power.

21 Claims, 13 Drawing Sheets

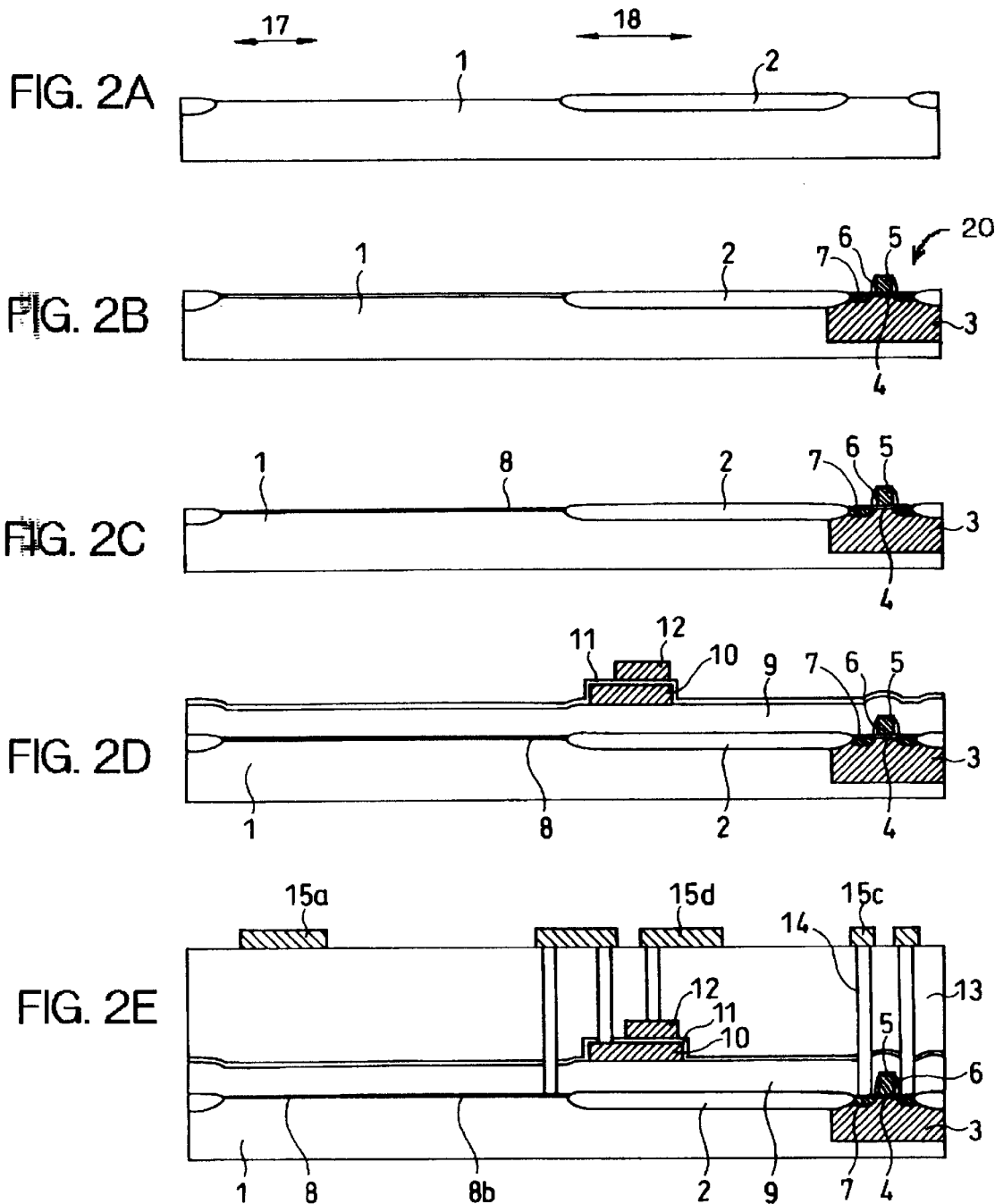

SEMICONDUCTOR DEVICE HAVING A HIGH FREQUENCY ELECTRONIC CIRCUIT

BACKGROUND OF THE INVENTION

1. Field of the Invention

The invention relates to a semiconductor device and a method of fabricating the same, and more particularly to a semiconductor device including a semiconductor substrate on which a high-frequency electronic circuit is integrated, a ground electrode formed on the semiconductor substrate, and a boding wire grounding the ground electrode therethrough, and a method of fabricating such a semiconductor device.

2. Description of the Related Art

In a high-frequency device, it is quite important to enhance noise characteristic of the device by reducing noises caused by a resistance of a substrate on which an integrated circuit is formed. To this end, a high-frequency device is often designed to include a low-resistive layer below a pad electrode with an interlayer insulating film being sandwiched therebetween. For instance, such a low-resistive layer is composed of silicide.

One of such a high-frequency device is disclosed in "Bonding pad models for silicon VLSI technologies and their effects on the Noise Figure of RF NPNs", IEEE MTT-S Digest, 1994, pp. 1179–1182.

FIG. 1A is a cross-sectional view of the high-frequency device disclosed in the above-mentioned digest.

The illustrated device is comprised of a silicon substrate 101 lying on a ground 120, a polysilicon silicide layer 108 formed on the silicon substrate 101, an interlayer insulating film 113 formed on both the silicon substrate 101 and the polysilicon silicide layer 108, a pad electrode 115a formed on the interlay insulating film 113, and a bonding wire 119 electrically connecting the polysilicon silicide layer 108 to the ground 120.

In the illustrated device, since the polysilicon silicide layer 108 is directly grounded through the bonding wire 119, it would be possible to prevent the device from being influenced by noises caused by a resistance of the silicon substrate 101.

However, the device illustrated in FIG. 1A is accompanied with the following problem.

FIG. 1B is a circuit diagram of a circuit equivalent to the device illustrated in FIG. 1A. That is, the device is equivalent to the circuit including a parasitic capacitor Cp in the pad electrode 115a, a resistance Rp in the silicon substrate 110, grounded at one end and electrically connected at the other end in series with the capacitor Cp, and an inductance Lb in the bonding wire 119, grounded at one end and electrically connected at the other end in series with the capacitor Cp, but in parallel with the resistance Rp.

As an operating frequency of the circuit becomes greater, an impedance ω Lb of the inductance Lb in the bonding wire 119 becomes unignorable. As a result, a current Ip running through the parasitic capacitor Cp of the pad electrode 115a runs also through the resistance Rp of the silicon substrate 101. Herein, the current Ip runs through the resistance Rp at a rate K defined by the following equation.

$$K = 100 \times \omega Lb / (Rp^2 + (\omega Lb)^2)^{1/2}$$

For instance, if the resistance Rp is equal to 150 Ω, a frequency f is equal to 5 GHz, and the inductance Lb is equal to 10 nH, the rate K is 90%. This means that almost all of the current Ip runs through the resistance Rp. As a result, the noise characteristic of the device is deteriorated due to noises caused by the resistance Rp of the silicon substrate 101.

The device illustrated in FIG. 1A is accompanied with another problem as follows.

Electric power W consumed by the resistance Rp is defined as follows.

$$W = Rp \times (K|Ip|/100)^2$$

Hence, as the rate K is increased, the electric power W consumed by the resistance Rp is also increased. Thus, power consumption in the device is increased.

Japanese Unexamined Patent Publication No. 7-120788 has suggested a semiconductor device a semiconductor substrate, a semiconductor active element formed on the semiconductor substrate, a power line through which electric power is supplied to the semiconductor active element, an electrode defining a capacity, and a dielectric substance defining a capacity. A reference voltage is applied to the electrode. At least a part of the electrode is designed to face the power line. The dielectric substance is positioned between the power line and the electrode.

Japanese Unexamined Patent Publication No. 8-102525 has suggested a semiconductor integrated circuit including (a) a plurality of circuit blocks each comprised of MISFET, a resistance of a wiring through which electric power is supplied is divided into sections so that a resistance in each of the sections can be ignored, (b) a plurality of first capacities each associated with each of the circuit blocks, each of the first capacities having a capacity sufficiently greater than a capacity of the associated circuit block, and (c) a second capacity positioned between external terminals, the second capacity having a capacity greater than a total capacity of the first capacities.

Japanese Unexamined Patent Publication No. 10-326868 has suggested a semiconductor device including a semiconductor integrated circuit device having a capacitor and a resistance which cooperate with each other to define a high-frequency noise cutting circuit. The high-frequency noise cutting circuit reduces static electricity noises generated in a signal line through which a clock signal is transmitted.

However, the problems of deterioration in the noise characteristics of the device and an increase in power consumption remain unsolved even in the semiconductor devices suggested in the above-mentioned Publications.

SUMMARY OF THE INVENTION

In view of the above-mentioned problems in the conventional semiconductor devices, it is an object of the present invention to provide a semiconductor device which is capable of enhancing noise characteristics and reducing power consumption.

It is also an object of the present invention to provide a method of fabricating such a semiconductor device as mentioned above.

In one aspect of the present invention, there is provided a semiconductor device including (a) a semiconductor substrate on which an integrated circuit is formed, (b) a ground electrode formed on the semiconductor substrate, (c) a bonding wire through which the ground electrode is grounded, the bonding wire having an inductance, and (d) a capacitor positioned in series with the inductance, the capacitor and the inductance cooperating with each other to form a resonance circuit at an operating frequency of the integrated circuit.

It is preferable that the capacitor is comprised of (d1) a lower electrode formed on or above the semiconductor substrate, (d2) an insulating film covering the lower electrode therewith, and (d3) an upper electrode formed on the insulating film above the lower electrode.

It is preferable that the lower electrode is comprised of a low-resistive layer formed on the semiconductor substrate.

For instance, the low-resistive layer is composed of silicide.

It is preferable that the operating frequency F is defined by the following equation, $$F=(1/2\ \pi)\times(1/(Lb\times C1))^{1/2},$$

wherein Lb indicates an inductance of the bonding wire, and C1 indicates a capacity of the capacitor.

There is further provided a semiconductor device including (a) a semiconductor substrate on which an integrated circuit is formed, (b) a ground electrode formed on the semiconductor substrate, (c) a bonding wire through which the ground electrode is grounded, the bonding wire having a first inductance, (d) a capacitor positioned in series with the first inductance, (e) an inductor having a second inductance, the inductor positioned in parallel with the capacitor, the capacitor, the first inductance and the second inductance cooperating with one another to form a resonance circuit at an operating frequency of the integrated circuit.

It is preferable that the capacitor is comprised of (d1) a lower electrode formed on or above the semiconductor substrate, (d2) an insulating film covering the lower electrode therewith, and (d3) an upper electrode formed on the insulating film above the lower electrode.

It is preferable that the lower electrode is comprised of a low-resistive layer formed on the semiconductor substrate. For instance, the low-resistive layer is composed of silicide.

It is preferable that the inductor is comprised of a wiring layer formed above the semiconductor substrate.

It is preferable that the wiring layer is formed just above the lower electrode.

It is preferable that the inductor is comprised of a wiring layer formed just above the low-resistive layer.

It is preferable that the semiconductor device further includes a current stopper formed in the lower electrode, the current stopper preventing generation of an eddy current caused by the second inductance.

It is preferable that the semiconductor device further includes a current stopper formed in the low-resistive layer, the current stopper preventing generation of an eddy current caused by the second inductance.

It is preferable that the current stopper is comprised of at least one cut-out formed in the lower electrode. As an alternative, the current stopper may be comprised of at least one cut-out formed in the low-resistive layer.

It is preferable that the current stopper is comprised of four cut-outs, two of them extending in a first direction and the remaining two of them extending in a second direction perpendicular to the first direction.

It is preferable that each of the four cut-outs inwardly extends from each of four edges of the low-resistive layer.

It is preferable that the operating frequency F is defined by the following equation, $F=(1/2\ \pi)\times((Lb+L1)/(C1\times Lb\times L1))^{1/2}$, wherein Lb indicates an inductance of the bonding wire, L1 indicates an inductance of the inductor, and C1 indicates a capacity of the capacitor.

It is preferable that the cut-out is filled with insulator.

The advantages obtained by the aforementioned present invention will be described hereinbelow.

In accordance with the present invention, there is defined a resonance circuit comprising an inductance of the bonding wire positioned in parallel with a resistance of the semiconductor substrate, and a capacitor electrically connected in series to the inductance. As an alternative, there is defined a resonance circuit comprising a first inductance of the bonding wire positioned in parallel with a resistance of the semiconductor substrate, a capacitor electrically connected in series to the first inductance, and a second inductance electrically connected in parallel with the capacitor. A high-frequency current runs through the resonance circuit. Accordingly, a high-frequency current no longer runs through the resistance of the semiconductor substrate. This ensures enhancement in noise characteristic of the device and reduction in power consumption in the device.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIGS. 2A to 2E are cross-sectional views of a semiconductor device in accordance with the first embodiment of the present invention, illustrating respective steps of a method of fabricating the same.

DESCRIPTION OF THE PREFERRED EMBODIMENTS

Figure 1A:
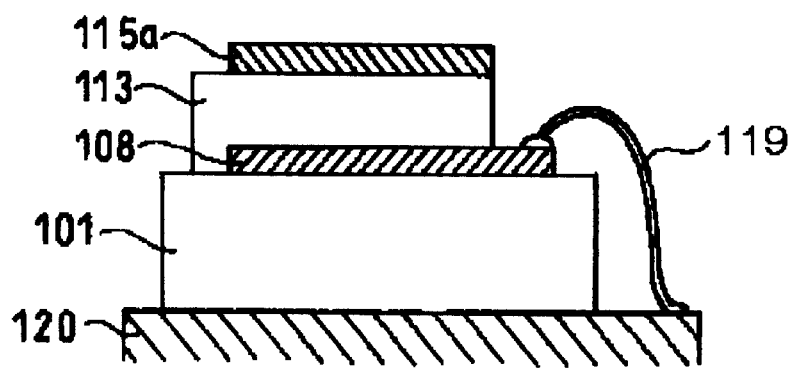
FIG. 1A is a cross-sectional view of a conventional semiconductor device.
Figure 1B:
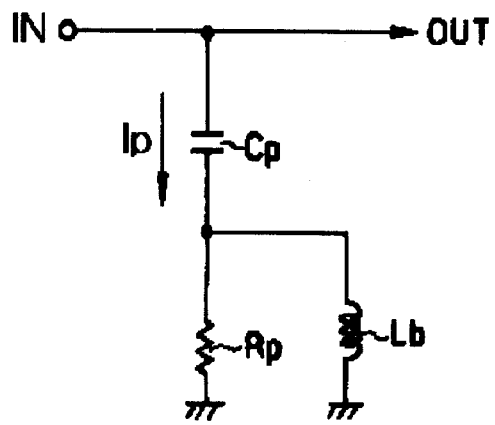
FIG. 1B is a circuit diagram of a circuit equivalent to the semiconductor device illustrated in FIG. 1A.

Preferred embodiments in accordance with the present invention will be explained hereinbelow with reference to drawings.

First Embodiment

In the first embodiment explained hereinbelow, the present invention is applied to an amplifier comprised of an n-channel MOSFET.

FIGS. 2A to 2E illustrate respective steps of a method of fabricating the amplifier in accordance with the first embodiment.

First, as illustrated in FIG. 2A, oxide films 2 are formed at a surface of a p-type silicon substrate 1 in selected regions. Each of the oxide films 2 has a thickness in the range of 200 to 500 nm. A semiconductor device is to be formed on the p-type silicon substrate 1 in a region sandwiched between the adjacent oxide films 2. The oxide films 2 are not formed in a region where a later mentioned pad electrode is to be formed.

Then, a p-type well 3 is formed in the p-type silicon substrate 1 by ion-implantation. Then, a gate oxide film 4 is formed on the p-type well 3 between the oxide films 2. The gate oxide film 4 has a thickness in the range of 2 to 10 nm. Then, a polysilicon film having a thickness in the range of 100 to 400 nm is formed on the gate oxide film 4, and is patterned into a gate electrode 5 by means of photolithography and dry etching.

Then, a sidewall 6 is formed around the gate electrode 5. Then, source and drain regions 7 are formed around the sidewall 6 in the silicon substrate 1 by ion-implantation, followed by rapid thermal annealing (RTA) at 1000 to 1100 degrees centigrade for 10 to 60 seconds, to thereby activate the source and drain regions 7, as illustrated in FIG. 2B. Thus, there is completed an integrated circuit 20 comprised of the p-type well 3, the gate oxide film 4, the gate electrode 5, the sidewall 6, and the source and drain regions 7.

Then, as illustrated in FIG. 2C, a silicide layer 8 as a low-resistive layer is formed on an exposed region of the silicon substrate 1.

Then, as illustrated in FIG. 2D, a first interlayer insulating film 9 is formed entirely over the product resulted from the previously mentioned step.

Then a polysilicon film having a thickness in the range of 100 to 300 nm is deposited on the first interlayer insulating film 9. Then, the polysilicon film is patterned into a lower electrode 10 by photolithography and dry etching. The thus formed lower electrode 10 partially constitutes a capacity.

Then, an insulating film 11 is formed all over the first interlayer insulating film 9 and the lower electrode 10. The insulating film 11 has a thickness in the range of 5 to 50 nm.

Then, a polysilicon or metal film is formed over the insulating film 11 by the thickness of 100 to 300 nm. Then, the polysilicon or metal film is patterned into an upper electrode 12 by photolithography and dry etching such that the upper electrode 12 is located above the lower electrode 10, as illustrated in FIG. 2D.

Then, a second interlayer insulating film 13 is deposited entirely over the product resulted from the previous step, by the thickness in the range of 800 nm to 1200 nm, as illustrated in FIG. 2E. Then, a plurality of contact holes 14 are formed through the second interlayer insulating film 13 by photolithography and dry etching. The thus formed contact holes 14 are filled with metal such as tungsten.

Then, a metal film such as an aluminum film is deposited on the second interlayer insulating film 13 by the thickness of 400 to 800 nm. Then, the metal film is patterned into a first pad electrode 15a, a second pad electrode 15d, an inductor wiring layer 15b and a wiring layer 15c by photolithography and dry etching, as illustrated in FIG. 2E.

Then, the second pad electrode 15d is grounded through a bonding wire not illustrated).

Thus, there is completed the semiconductor device in accordance with the first embodiment.

In the first embodiment, the lower electrode 10, the insulating film 11 and the upper electrode 12 define a capacity.

Figure 3:
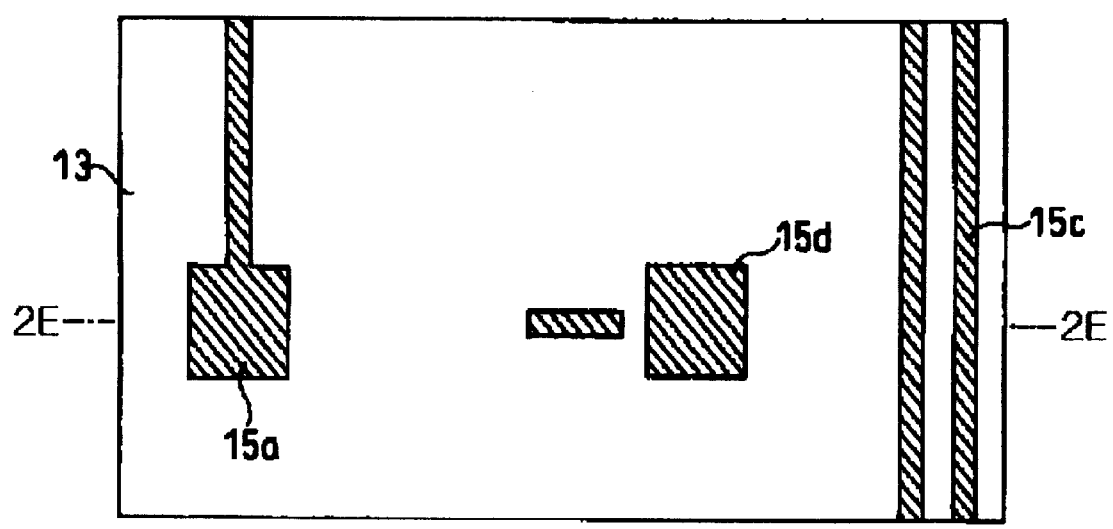
FIG. 3 is a top view of the semiconductor device resulted from the method illustrated in FIGS. 2A to 2E.

FIG. 3 is a top view of the product resulted from the step illustrated in FIG. 2E. FIG. 2E is a cross-sectional view taken along the line 2E–2E in FIG. 3.

Figure 4:
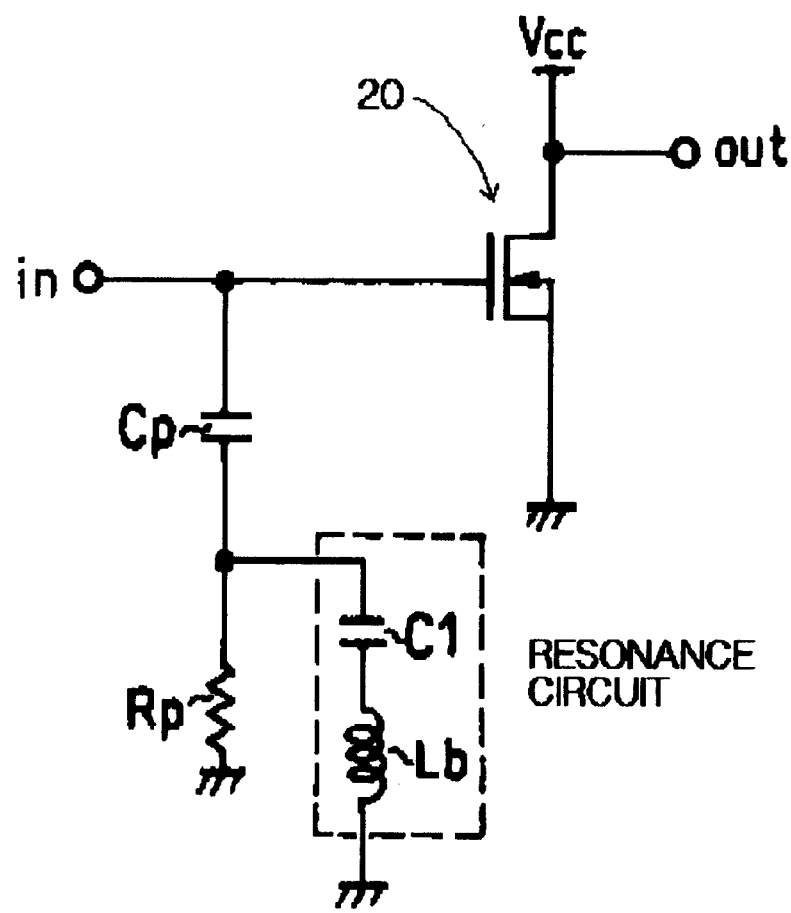
FIG. 4 is a circuit diagram of a circuit equivalent to the semiconductor device in accordance with the first embodiment.

FIG. 4 is a circuit diagram of a circuit equivalent to the thus fabricated semiconductor device. As illustrated in FIG. 4, the semiconductor device in accordance with the first embodiment is equivalent to a circuit comprised of a transistor 20 including a gate through which a signal is input, a source electrically connected to a source voltage Vcc, and a drain grounded, a parasitic capacitor Cp of the first pad electrode 15a, electrically connected to the gate of the transistor 20, a resistance Rp of the silicon substrate 1 electrically connected in series at one end to the capacitor Cp and at the other end grounded, a capacitor C1 having a capacity defined by the lower electrode 10, the insulating film 11 and the upper electrode 12, and electrically connected in series to the capacitor Cp and in parallel with the resistance Rp, and an inductance Lb of the bonding wire electrically connected in series at one end to the capacitor C1 and grounded at the other end.

In this circuit illustrated in FIG. 4, the capacitor C1 and the inductance Lb cooperate with each other to define a resonance circuit. A capacity of the capacitor C1 is determined such that the capacity resonates with the inductance Lb of the bonding wire at an operating frequency F of the integrated circuit 20. That is, a capacity of the capacitor C1 is determined so that the following equation (A) is established.

$$F=(1/2\ \pi)\times(1/(Lb\times C1))1/^{1/2} \quad\quad (A)$$

In accordance with the first embodiment, the inductance Lb and the capacity C1 are short-circuited with each other by resonance at the operating frequency F of the integrated circuit 20, as illustrated in FIG. 4. Accordingly, a high-frequency current does not run through the resistance Rp of the silicon substrate 1. Hence, the resistance Rp does not generate noises.

Figure 5:
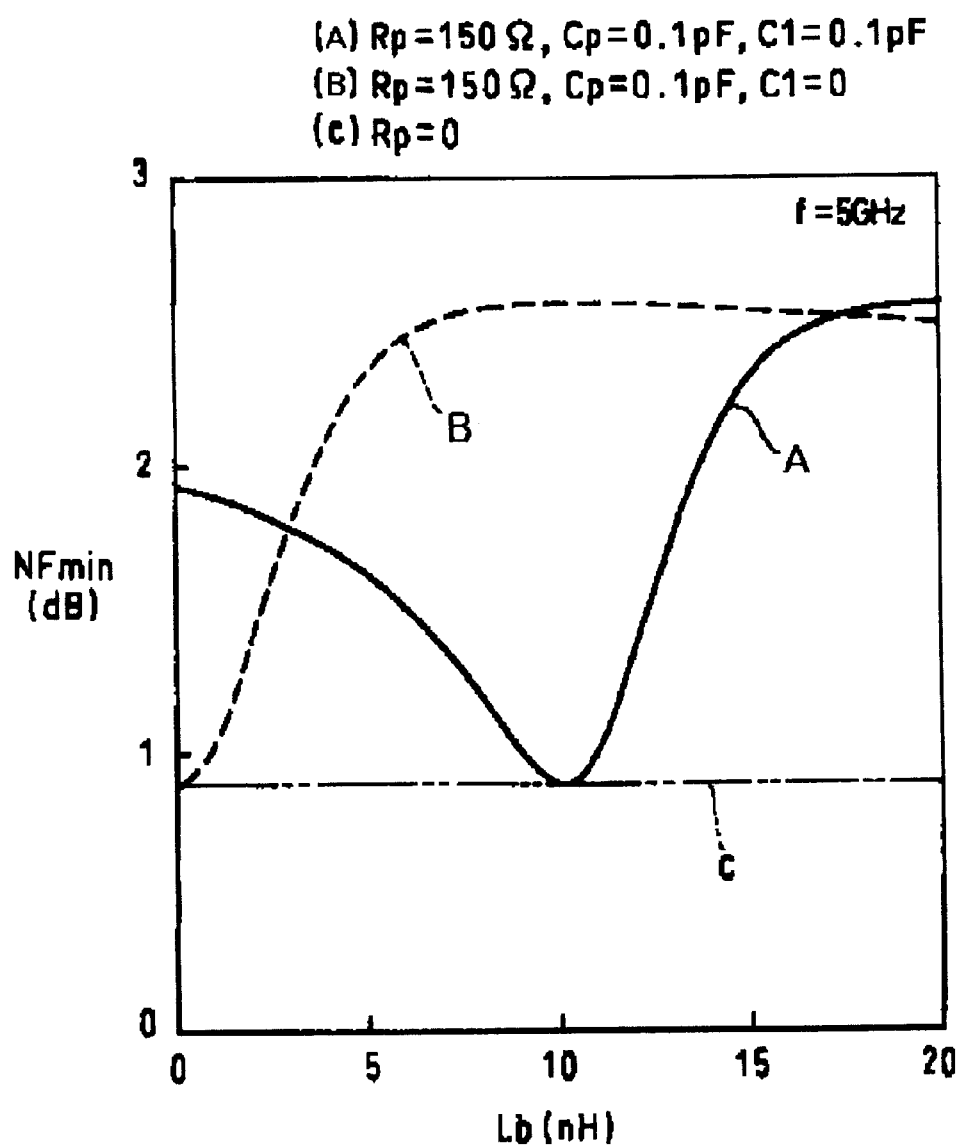
FIG. 5 is a graph showing a relation between an inductance of a bonding wire and a minimum noise factor.

The inventor conducted the experiment to verify that resistance Rp did not generate noises. In the experiment, the operating frequency F was set equal to 5 GHz, the resistance Rp was set equal to 150 Ω, the parasitic capacity Cp of the first pad electrode 15a was set equal to 0.5 pF, the capacity C1 was set equal to 0.1 pF, and the inductance Lb of the bonding wire was made to vary in the range of 5 nH to 15 nH. Under those conditions, a minimum noise factor NFmin was measured. The results are shown in FIG. 5 with the line A. The results of measuring a minimum noise factor NFmin in a conventional semiconductor device are also shown in FIG. 5 with the line B.

As is understood in view of FIG. 5, the minimum noise factor NFmin increases as the inductance Lb increases in the conventional semiconductor device, that is, a semiconductor device not having the capacity C1. To the contrary, in the semiconductor device in accordance with the first embodiment, that is, the semiconductor device having the capacity C1, when the inductance Lb is equal to nH by which the above-mentioned equation (A) is established, the minimum noise factor NFmin is equal to a local minimum value.

In addition, the local minimum value of the minimum noise factor NFmin is coincident with a minimum noise factor NFmin in a semiconductor device not having the resistance Rp, indicated with the line C.

In addition, even if the inductance Lb of the bonding wire has a dispersion within about 10%, it would be possible to make the minimum noise factor NFmin equal to or smaller than 1 dB.

As mentioned so far, the first embodiment makes it possible to reduce noises. In addition, since no electric power is consumed by the resistance Rp, the first embodiment makes it possible to reduce power consumption.

Second Embodiment

In the second embodiment explained hereinbelow, the present invention is applied to an amplifier comprised of an n-channel MOSFET.

FIGS. 6A to 6E illustrate respective steps of a method of fabricating the amplifier in accordance with the second embodiment. Parts or elements that correspond to those illustrated in FIGS. 2A to 2E have been provided with the same reference numerals.

Figure 6A:
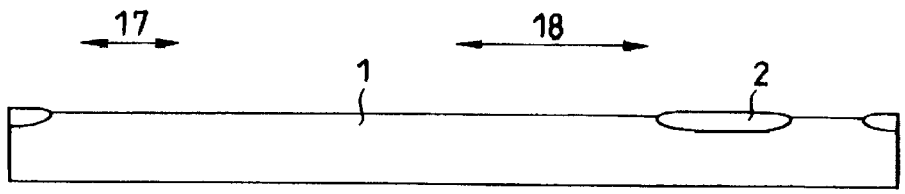
FIGS. 6A to 6E are cross-sectional views of a semiconductor device in accordance with the second embodiment of the present invention, illustrating respective steps of a method of fabricating the same.

First, as illustrated in FIG. 6A, oxide films 2 are formed at a surface of a p-type silicon substrate 1 in selected regions by the thickness in the range of 200 to 500 nm. A semiconductor device is to be formed on the p-type silicon substrate 1 in a region sandwiched between the adjacent oxide films 2. The oxide films 2 are not formed in a region 17 where a later mentioned pad electrode is to be formed.

Then, a p-type well 3 is formed in the p-type silicon substrate 1 by ion-implantation. Then, a gate oxide film 4 is formed on the p-type well 3 between the oxide films 2. The gate oxide film 4 has a thickness in the range of 2 to 10 nm. Then, a polysilicon film having a thickness in the range of 100 to 400 nm is formed on the gate oxide film 4, and is patterned into a gate electrode 5 by means of photolithography and dry etching.

Figure 6B:
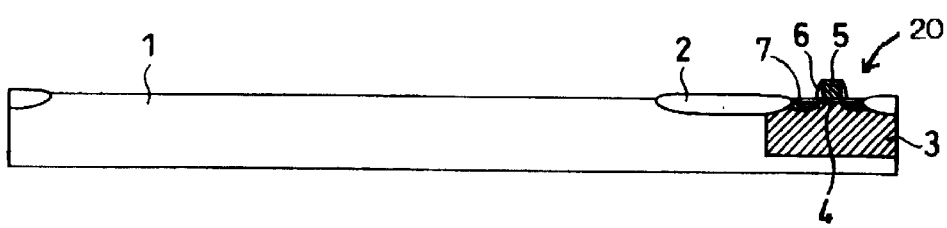

Then, a sidewall 6 is formed around the gate electrode 5. Then, source and drain regions 7 are formed around the sidewall 6 in the silicon substrate 1 by ion-implantation, followed by rapid thermal annealing (RTA) at 1000 to 1100 degrees centigrade for 10 to 60 seconds, to thereby activate the source and drain regions 7, as illustrated in FIG. 6B. Thus, there is completed an integrated circuit 20 comprised of the p-type well 3, the gate oxide film 4, the gate electrode 5, the sidewall 6, and the source and drain regions 7.

Figure 6C:
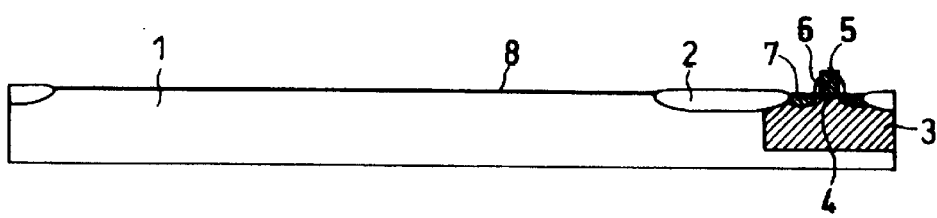

Then, as illustrated in FIG. 6C, a silicide layer 8 as a low-resistive layer is formed on an exposed region of the silicon substrate 1. The suicide layer 8 is also formed in the region 17. The silicide layer 8 acts as a lower electrode 8a partially constituting a later mentioned capacitor.

Figure 6D:
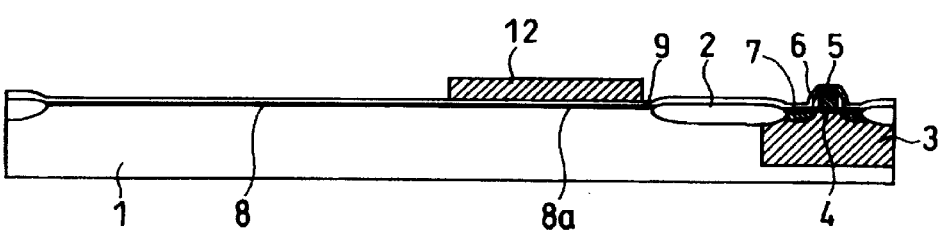

Then, as illustrated in FIG. 6D, an insulating film 9 is formed entirely over the product resulted from the previous step, by the thickness in the range of 5 nm to 50 nm.

Then a polysilicon film having a thickness in the range of 100 to 300 nm is deposited on the insulating film 9. Then, the polysilicon film is patterned into an upper electrode 12 by photolithography and dry etching, as illustrated in FIG. 6D.

Figure 6E:
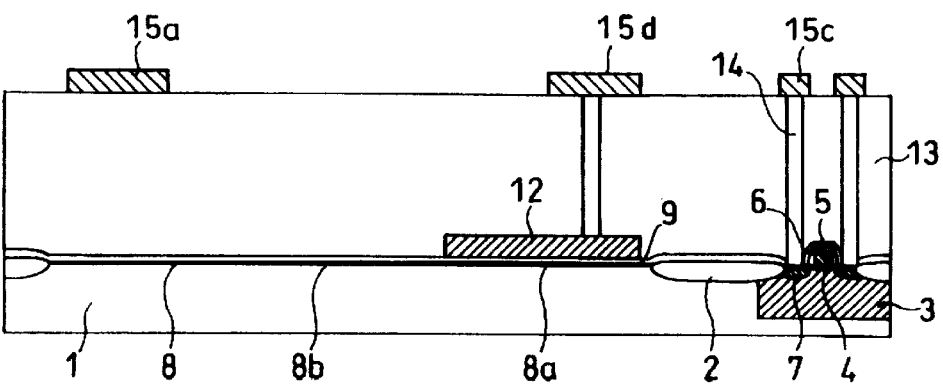

Then, an interlayer insulating film 13 is deposited entirely over the product resulted from the previous step, by the thickness in the range of 800 nm to 1200 nm, as illustrated in FIG. 6E. Then, a plurality of contact holes 14 are formed through the interlayer insulating film 13 by photolithography and dry etching. The thus formed contact holes 14 are filled with metal such as tungsten.

Then, a metal film such as an aluminum film is deposited on the interlayer insulating film 13 by the thickness of 400 to 800 nm. Then, the metal film is patterned into a first pad electrode 15a, a second pad electrode 15d and a wiring layer 15c by photolithography and dry etching, as illustrated in FIG. 6E. Then, the second pad electrode 15d is grounded through a bonding wire 19 (see FIG. 8).

Thus, there is completed the semiconductor device in accordance with the second embodiment.

In the second embodiment, the silicide layer 8, the insulating film 9 and the upper electrode 12 define a capacity.

Figure 7:
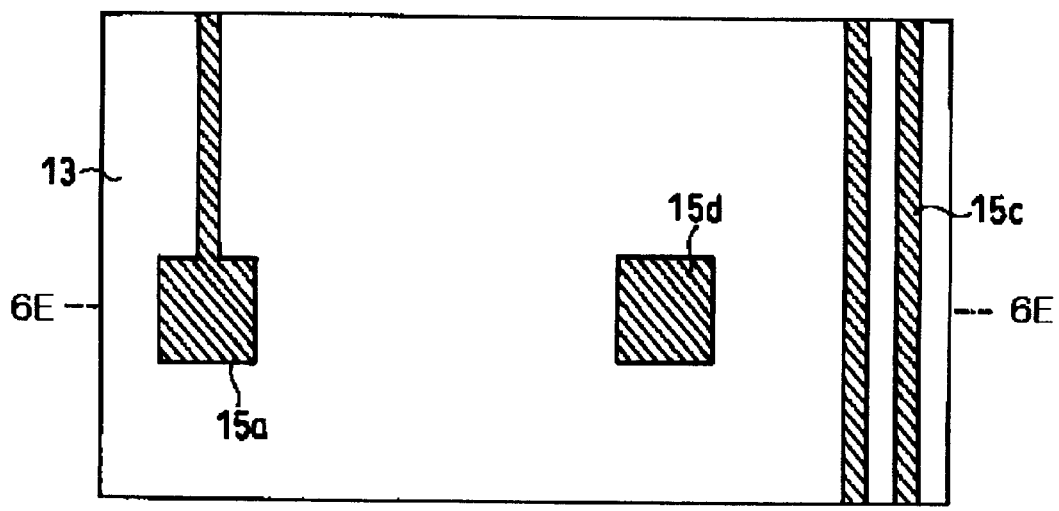
FIG. 7 is a top view of the semiconductor device resulted from the method illustrated in FIGS. 6A to 6E.

FIG. 7 is a top view of the product resulted from the step illustrated in FIG. 6E. FIG. 6E is a cross-sectional view taken along the line 6E—6E in FIG. 7.

A circuit equivalent to the thus fabricated semiconductor device is the same as the circuit illustrated in FIG. 4.

Figure 8:
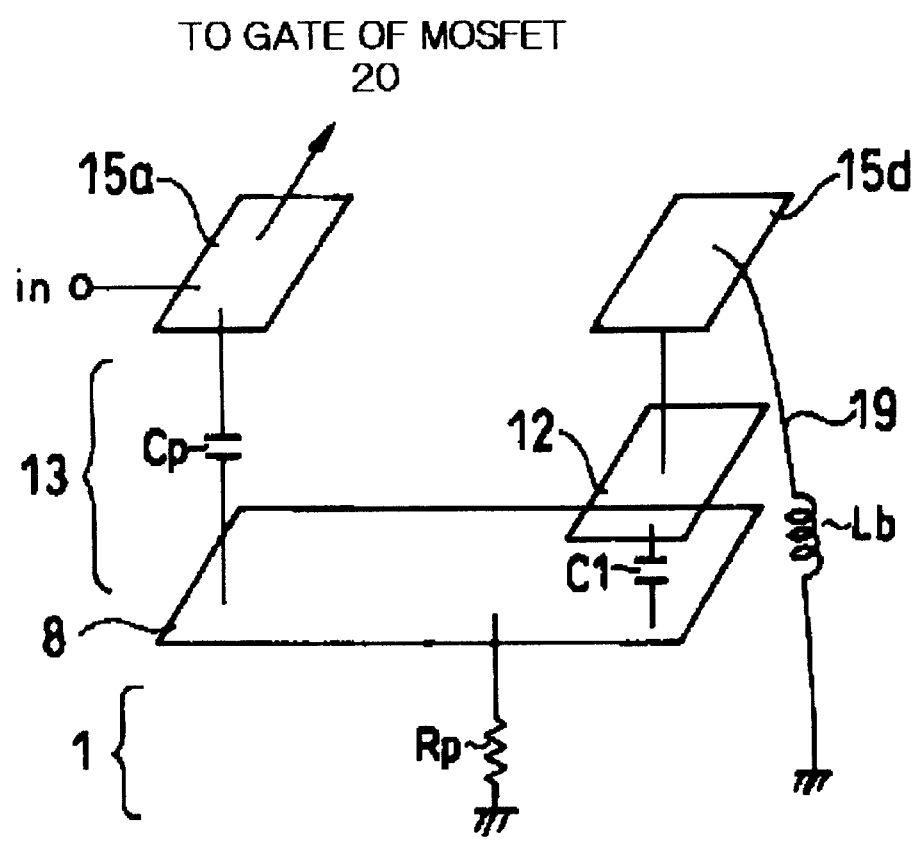
FIG. 8 is a circuit diagram of a circuit equivalent to the semiconductor device in accordance with the second embodiment, and illustrates positional relation between the equivalent circuit and the semiconductor device.

FIG. 8 illustrates a positional relation between the equivalent circuit and the semiconductor device in accordance with the second embodiment.

With reference to FIG. 8, the capacitor C1 having a capacity defined by the suicide layer 8, the insulating film 9 and the upper electrode 12, and the inductance Lb of the bonding wire 19 cooperate with each other to define a resonance circuit. A capacity of the capacitor C1 is determined such that the capacity resonates with the inductance Lb at an operating frequency F of the integrated circuit 20. That is, a capacity of the capacitor C1 is determined so that the following equation (A) is established.

$$F = (1/2\,\pi) \times (1/(Lb \times C1))^{1/2} \tag{A}$$

In accordance with the second embodiment, the inductance Lb and the capacity C1 are short-circuited with each other by resonance at the operating frequency F of the integrated circuit 20. Accordingly, a high-frequency current does not run through the resistance Rp of the silicon substrate 1. Hence, the resistance Rp does not generate noises.

The second embodiment provides not only the same advantages obtained by the first embodiment, but also the advantage that the number of fabrication steps can be reduced in comparison with the first embodiment, because the silicide layer 8 is used as the lower electrode 8a in the capacitor C1.

Third Embodiment

In the third embodiment explained hereinbelow, the present invention is applied to an amplifier comprised of an n-channel MOSFET.

FIGS. 9A to 9E illustrate respective steps of a method of fabricating the amplifier in accordance with the third embodiment. Parts or elements that correspond to those illustrated in FIGS. 2A to 2E have been provided with the same reference numerals.

Figure 9:
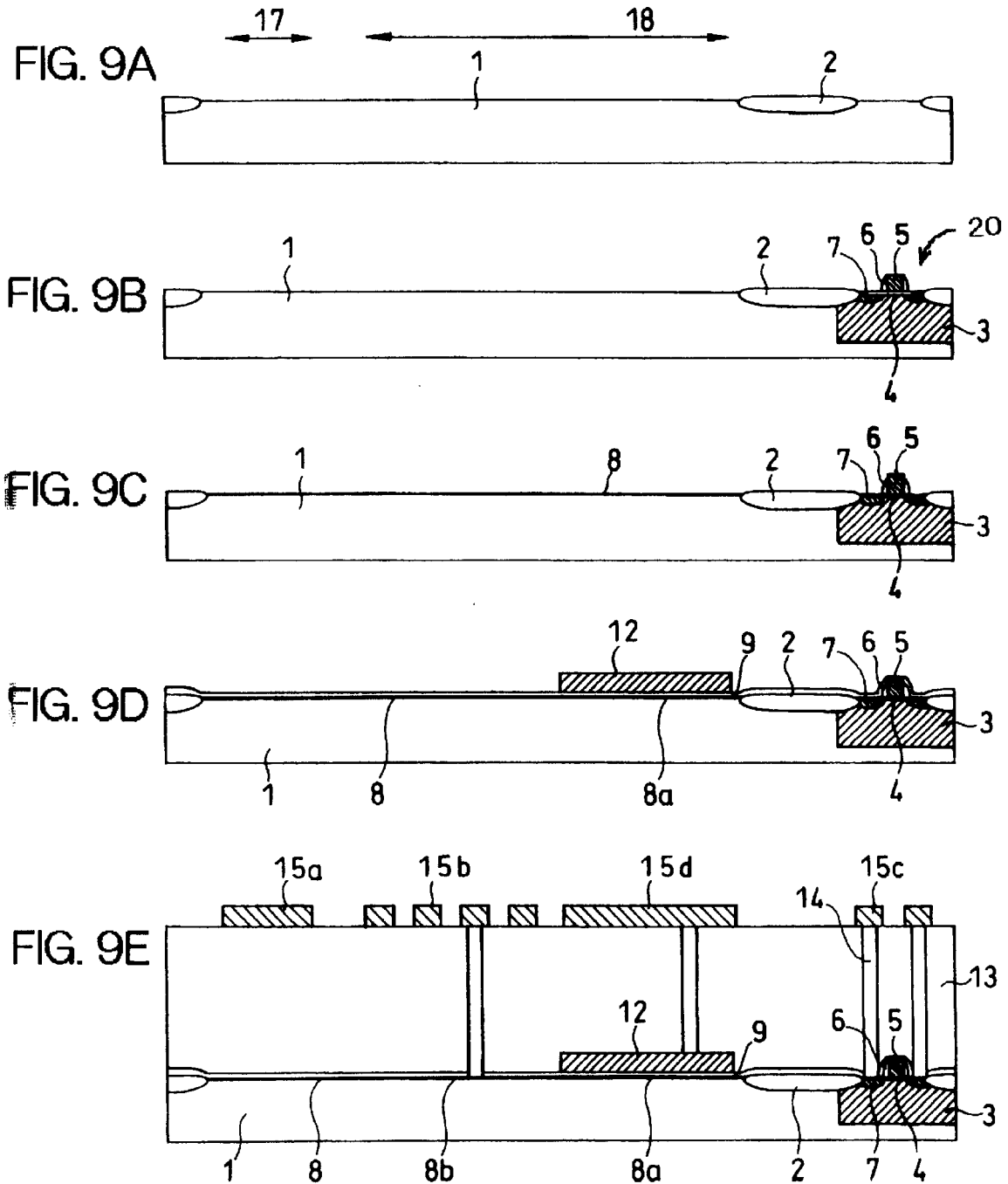
FIGS. 9A to 9E are cross-sectional views of a semiconductor device in accordance with the third embodiment of the present invention, illustrating respective steps of a method of fabricating the same.

First, as illustrated in FIG. 9A, oxide films 2 are formed at a surface of a p-type silicon substrate 1 in selected regions by the thickness in the range of 200 to 500 nm. A semiconductor device is to be formed on the p-type silicon substrate 1 in a region sandwiched between the adjacent oxide films 2. The oxide films 2 are not formed in a region 17 where a later mentioned pad electrode is to be formed.

Then, a p-type well 3 is formed in the p-type silicon substrate 1 by ion-implantation. Then, a gate oxide film 4 is formed on the p-type well 3 between the oxide films 2 by the thickness in the range of 2 to 10 nm. Then, a polysilicon film having a thickness in the range of 100 to 400 nm is formed on the gate oxide film 4, and is patterned into a gate electrode 5 by means of photolithography and dry etching.

Then, a sidewall 6 is formed around the gate electrode 5. Then, source and drain regions 7 are formed around the sidewall 6 in the silicon substrate 1 by ion-implantation, followed by rapid thermal annealing (RTA) at 1000 to 1100 degrees centigrade for 10 to 60 seconds, to thereby activate the source and drain regions 7, as illustrated in FIG. 9B. Thus, there is completed an integrated circuit 20 comprised of the p-type well 3, the gate oxide film 4, the gate electrode 5, the sidewall 6, and the source and drain regions 7.

Then, as illustrated in FIG. 9C, a silicide layer 8 as a low-resistive layer is formed on an exposed region of the silicon substrate 1. The silicide layer 8 is also formed in the region 17. The silicide layer 8 acts as a lower electrode 8a partially constituting a later mentioned capacitor.

Then, as illustrated in FIG. 9D, an insulating film 9 is formed entirely over the product resulted from the previous step, by the thickness in the range of 5 nm to 50 nm.

Then a polysilicon film having a thickness in the range of 100 to 300 nm is deposited on the insulating film 9. Then, the polysilicon film is patterned into an upper electrode 12 by photolithography and dry etching, as illustrated in FIG. 9D.

Then, an interlayer insulating film 13 is deposited entirely over the product resulted from the previous step, by the thickness in the range of 800 nm to 1200 nm, as illustrated in FIG. 9E. Then, a plurality of contact holes 14 are formed through the interlayer insulating film 13 by photolithography and dry etching. The thus formed contact holes 14 are filled with metal such as tungsten.

Then, a metal film such as an aluminum film is deposited on the interlayer insulating film 13 by the thickness of 400 to 800 nm. Then, the metal film is patterned into a first pad electrode 15a, a second pad electrode 15d, an inductor wiring 15b and a wiring layer 15c by photolithography and dry etching, as illustrated in FIG. 9E.

The inductor wiring 15b is located above the silicide layer 8, but not above the upper electrode 12 in order to be spaced away from the silicon substrate 1, to thereby reduce a capacity relative to the silicon substrate 1.

Then, the second pad electrode 15d is grounded through a bonding wire (not illustrated).

Thus, there is completed the semiconductor device in accordance with the third embodiment.

In the third embodiment, the silicide layer 8, the insulating film 9 and the upper electrode 12 define a capacity.

Figure 11:
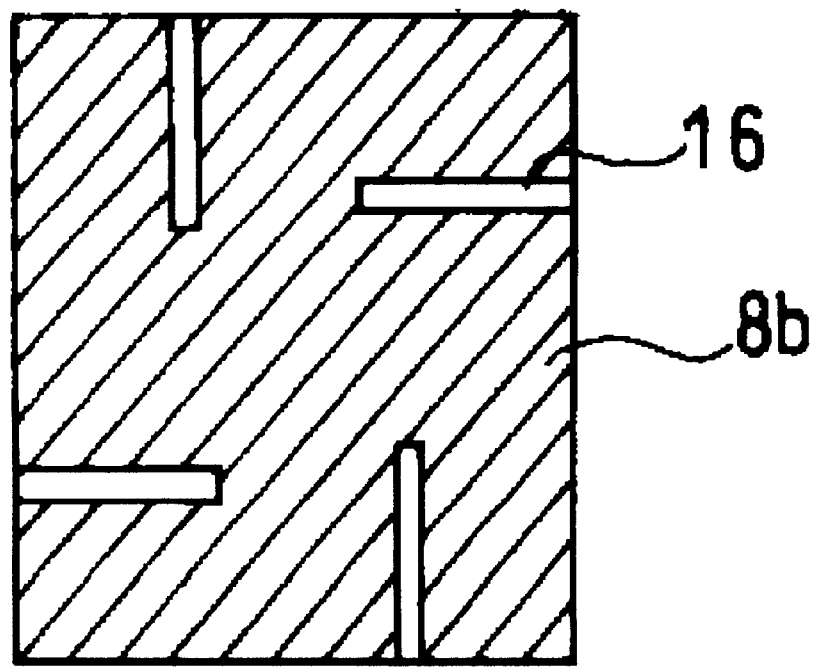
FIG. 11 is a top view of a suicide layer in the semiconductor device in accordance with the third embodiment.

As illustrated in FIG. 11, the silicide layer 8b located below the inductor wiring 15b is formed with four cut-outs 16. The cut-outs 16 are filled with oxide. Hence, the cut-outs 16 act like the oxide films 2. The cut-outs 16 filled with oxide suppress the inductor wiring 15b located above the cut-outs 16 from generating eddy current.

Figure 10:
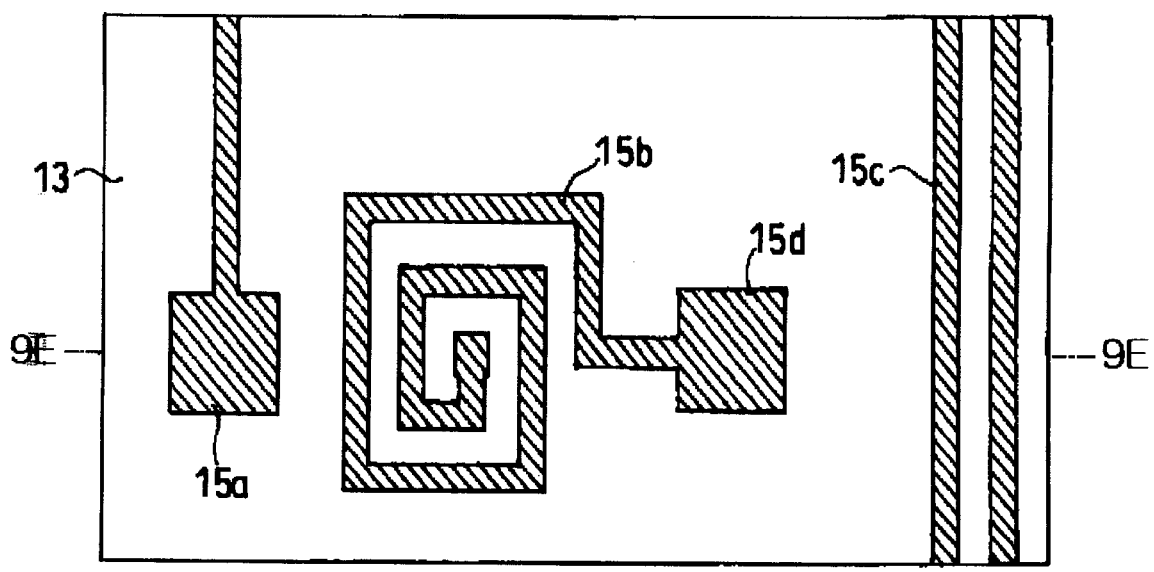
FIG. 10 is a top view of the semiconductor device resulted from the method illustrated in FIGS. 9A to 9E.

FIG. 10 is a top view of the product resulted from the step illustrated in FIG. 9E. FIG. 9E is a cross-sectional view taken along the line 9E—9E in FIG. 10.

Figure 12A:
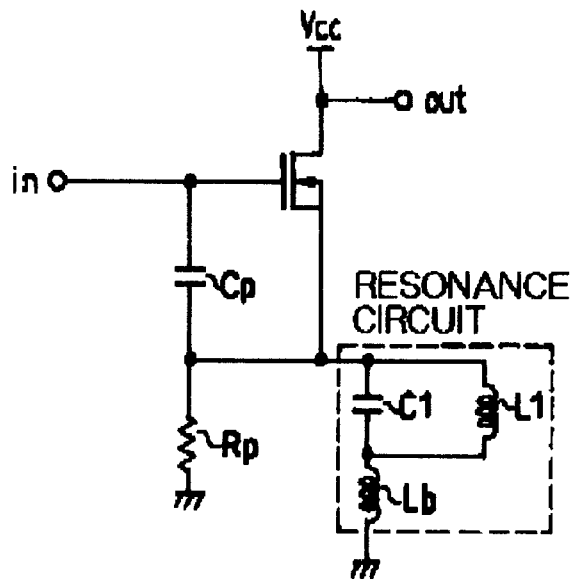
FIG. 12A is a circuit diagram of a circuit equivalent to the fabricated semiconductor device.
Figure 12B:
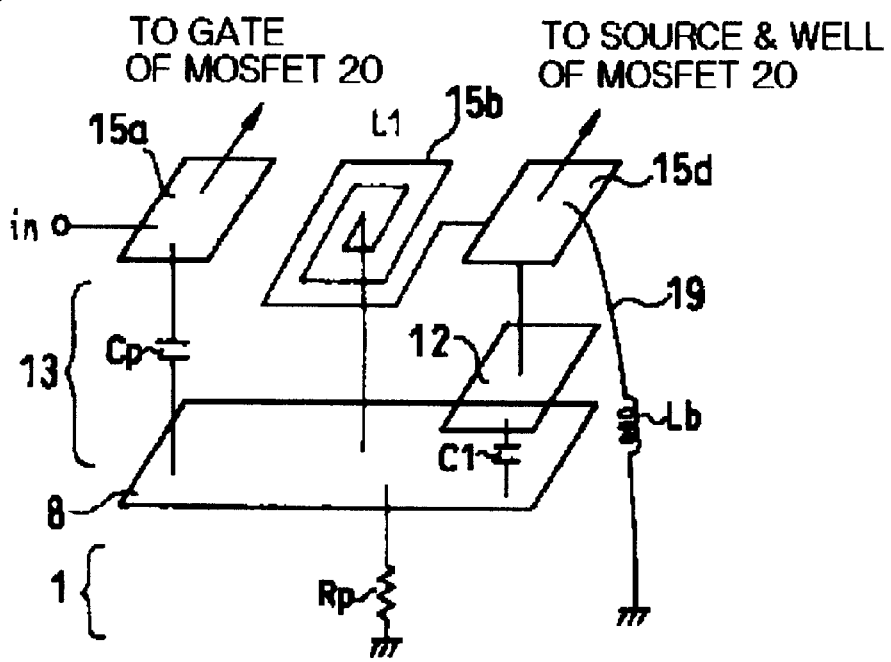
FIG. 12B illustrates a position relation between the equivalent circuit and the semiconductor device in accordance with the third embodiment.

FIG. 12A is a circuit diagram of a circuit equivalent to the thus fabricated semiconductor device, and FIG. 12B illustrates a positional relation between the equivalent circuit and the semiconductor device in accordance with the third embodiment.

As illustrated in FIG. 12A, the semiconductor device in accordance with the third embodiment is equivalent to a circuit comprised of a transistor 20 including a gate through which a signal is input, a source electrically connected to a source voltage Vcc, and a drain electrically connected to a later mentioned resonance circuit, a parasitic capacitor Cp of the first pad electrode 15a, electrically connected to the gate of the transistor 20, a resistance Rp of the silicon substrate 1 electrically connected in series at one end to the capacitor Cp and at the other end grounded, a capacitor C1 having a capacity defined by the silicide layer 8, the insulating film 9 and the upper electrode 12, and electrically connected in series to the capacitor Cp and in parallel with the resistance Rp, an inductance Lb of the bonding wire electrically connected in series at one end to the capacitor C1 and grounded at the other end, and an inductance L1 of the inductor wiring 15b electrically connected in parallel with the capacitor C1.

In this circuit illustrated in FIG. 12A, the capacitor C1 and the inductances Lb and L1 cooperate with one another to define a resonance circuit. The inductance L1 and a capacity of the capacitor C1 are determined such that they resonate with the inductance Lb of the bonding wire at an operating frequency F of the integrated circuit 20. That is, the inductance L1 and a capacity of the capacitor C1 are determined so that the following equation (B) is established.

$$F=(1/2\ \pi)\times((Lb+L1)/(C1\times Lb\times L1))^{1/2}$$

In accordance with the third embodiment, the inductances Lb and L1 and the capacity C1 are short-circuited with each other by resonance at the operating frequency F of the integrated circuit 20, as illustrated in FIG. 12A.

Accordingly, a high-frequency current does not run through the resistance Rp of the silicon substrate 1. Hence, the resistance Rp does not generate noises.

Figure 13:
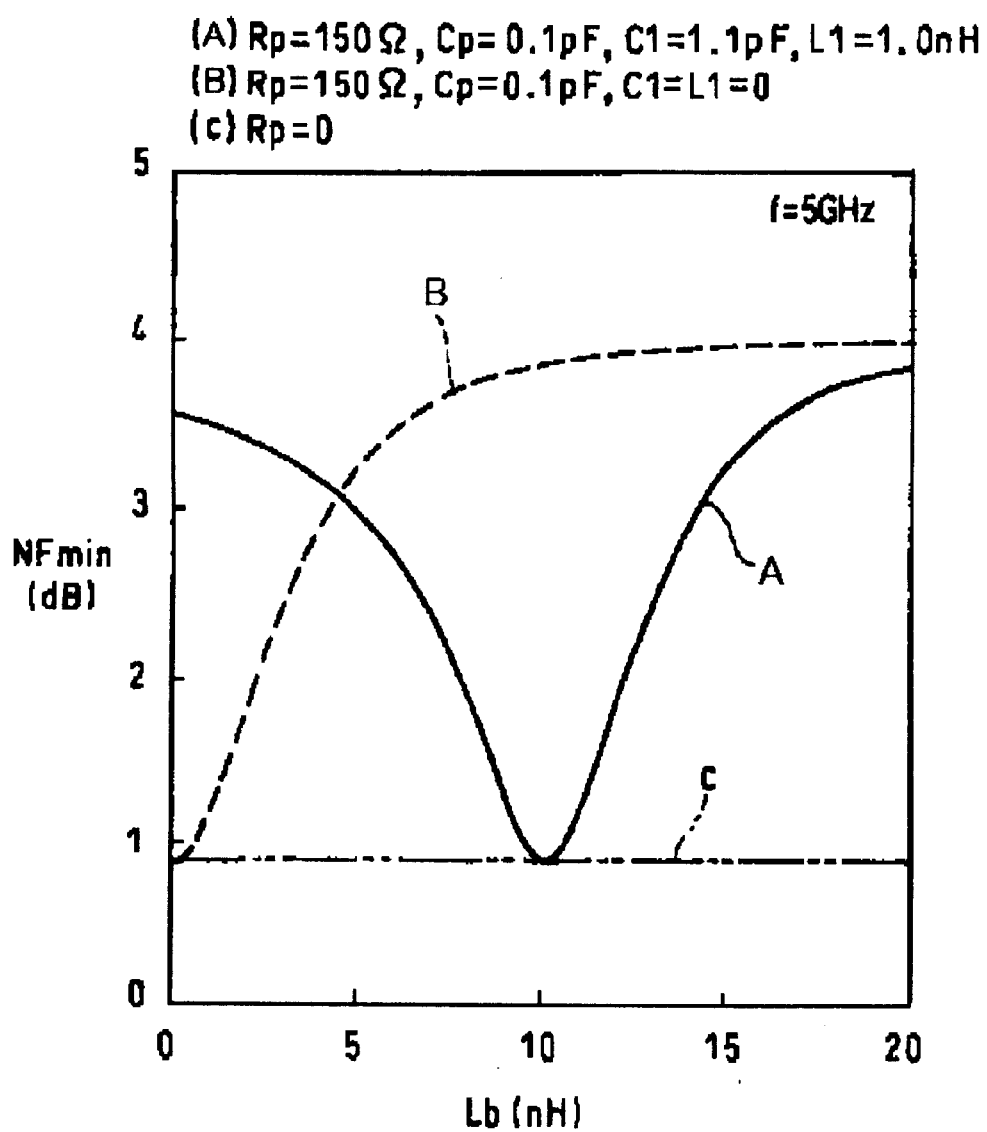
FIG. 13 is a graph showing the results of measuring a minimum noise factor.

The inventor conducted the experiment to verify that resistance Rp did not generate noises. In the experiment, the operating frequency F was set equal to 5 GHz, the resistance Rp was set equal to 150 Ω, the parasitic capacity Cp of the first pad electrode 15a was set equal to 0.5 pF, the inductance L1 was set equal to 1 nH, the capacity C1 was set equal to 1.1 pF, and the inductance Lb of the bonding wire was made to vary in the range of 5 nH to 15 nH. Under those conditions, a minimum noise factor NFmin was measured. The results are shown in FIG. 13 with the line A. The results of measuring a minimum noise factor NFmin in a conventional semiconductor device are also shown in FIG. 13 with the line B.

As is understood in view of FIG. 13, the minimum noise factor NFmin increases as the inductance Lb increases in the conventional semiconductor device, that is, a semiconductor device not having the inductance L1 and the capacity C1. To the contrary, in the semiconductor device in accordance with the third embodiment, that is, the semiconductor device having the inductance L1 and the capacity C1, when the inductance Lb is equal to 10 nH by which the above-mentioned equation (B) is established, the minimum noise factor NFmin is equal to a local minimum value.

In addition, the local minimum value of the minimum noise factor NFmin is coincident with a minimum noise factor NFmin in a semiconductor device not having the resistance Rp, indicated with the line C.

In addition, even if the inductance Lb of the bonding wire has a dispersion within about 5%, it would be possible to make the minimum noise factor NFmin equal to or smaller than 1 dB.

As mentioned so far, the third embodiment makes it possible to reduce noises. In addition, since no electric power is consumed by the resistance Rp, the first embodiment makes it possible to reduce power consumption.

In addition, the resonance circuit comprised of the inductances Lb and L1 and the capacitor C1 is short-circuited when a DC current runs therethrough, the resonance circuit may be used together with a ground terminal of a device such as MOSFET, as is understood in view of FIG. 12A.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-137937 filed on May 19, 1999 including specification, claims, drawings and summary is incorporated herein by reference in its entirety.

What is claimed is:

1. A semiconductor device comprising:
   (a) a semiconductor substrate on which an integrated circuit is formed;
   (b) a ground electrode formed on said semiconductor substrate;
   (c) a bonding wire through which said ground electrode is grounded, said bonding wire having an inductance; and
   (d) a capacitor positioned in series with said inductance, said capacitor and said inductance cooperating with each other to form a resonance circuit at an operating frequency of said integrated circuit.

2. The semiconductor device as set forth in claim 1, wherein said capacitor is comprised of:
   (d1) a lower electrode formed on or above said semiconductor substrate;
   (d2) an insulating film covering said lower electrode therewith; and
   (d3) an upper electrode formed on said insulating film above said lower electrode.

3. The semiconductor device as set forth in claim 2, wherein said lower electrode is comprised of a low-resistive layer formed on said semiconductor substrate.

4. The semiconductor device as set forth in claim 3, wherein said low-resistive layer is composed of silicide.

5. The semiconductor device as set forth in claim 1, wherein said operating frequency F is defined by the following equation:

$$F=(1/2\pi)\times(1/(Lb\times C1))^{1/2}$$

wherein Lb indicates an inductance of said bonding wire, and C1 indicates a capacity of said capacitor.

6. A semiconductor device comprising:
   (a) a semiconductor substrate on which an integrated circuit is formed;
   (b) a ground electrode formed on said semiconductor substrate;
   (c) a bonding wire through which said ground electrode is grounded, said bonding wire having a first inductance;
   (d) a capacitor positioned in series with said first inductance;
   (e) an inductor having a second inductance, said inductor positioned in parallel with said capacitor,
      said capacitor, said first inductance and said second inductance cooperating with one another to form a resonance circuit at an operating frequency of said integrated circuit.

7. The semiconductor device as set forth in claim 6, wherein said capacitor is comprised of:
   (d1) a lower electrode formed on or above said semiconductor substrate;
   (d2) an insulating film covering said lower electrode therewith; and
   (d3) an upper electrode formed on said insulating film above said lower electrode.

8. The semiconductor device as set forth in claim 7, wherein said lower electrode is comprised of a low-resistive layer formed on said semiconductor substrate.

9. The semiconductor device as set forth in claim 8, wherein said low-resistive layer is composed of suicide.

10. The semiconductor device as set forth in claim 6, wherein said inductor is comprised of a wiring layer formed above said semiconductor substrate.

11. The semiconductor device as set forth in claim 10, wherein said wiring layer is formed just above said lower electrode.

12. The semiconductor device as set forth in claim 8, wherein said inductor is comprised of a wiring layer formed just above said low-resistive layer.

13. The semiconductor device as set forth in claim 6, further comprising a current stopper formed in said lower electrode, said current stopper preventing generation of an eddy current caused by said second inductance.

14. The semiconductor device as set forth in claim 12, further comprising a current stopper formed in said low-resistive layer, said current stopper preventing generation of an eddy current caused by said second inductance.

15. The semiconductor device as set forth in claim 13, wherein said current stopper is comprised of at least one cut-out formed in said lower electrode.

16. The semiconductor device as set forth in claim 14, wherein said current stopper is comprised of at least one cut-out formed in said low-resistive layer.

17. The semiconductor device as set forth in claim 16, wherein said current stopper is comprised of four cut-outs, two of them extending in a first direction and the remaining two of them extending in a second direction perpendicular to said first direction.

18. The semiconductor device as set forth in claim 17, wherein each of said four cut-outs inwardly extends from each of four edges of said low-resistive layer.

19. The semiconductor device as set forth in claim 18, wherein said operating frequency F is defined by the following equation.

$$F=(1/2\pi)\times((Lb+L1)/(C1\times Lb\times L1))^{1/2}$$

wherein Lb indicates an inductance of said bonding wire, L1 indicates an inductance of said inductor, and C1 indicates a capacity of said capacitor.

20. The semiconductor device as set forth in claim 15, wherein said cut-out is filled with insulator.

21. The semiconductor device as set forth in claim 16, wherein said cut-out is filled with insulator.

* * * * *